United States Patent [19]

Chang et al.

[11] Patent Number: 5,175,453

[45] Date of Patent: Dec. 29, 1992

[54] CONFIGURABLE PULSE GENERATOR, ESPECIALLY FOR IMPLEMENTING SIGNAL DELAYS IN SEMICONDUCTOR DEVICES

[75] Inventors: Yen C. Chang, Saratoga; Jimmy Wong, Cupertino, both of Calif.

[73] Assignee: LSI Logic Corporation, Milpitas, Calif.

[21] Appl. No.: 847,857

[22] Filed: Mar. 9, 1992

Related U.S. Application Data

[63] Continuation of Ser. No. 568,268, Aug. 15, 1990, abandoned.

[51] Int. Cl.[5] .................... H03K 5/13; H03K 5/159
[52] U.S. Cl. .................... 307/603; 307/600; 307/601; 307/269; 328/55
[58] Field of Search ............. 307/600, 601, 603, 597, 307/262, 269; 328/55, 155

[56] References Cited

U.S. PATENT DOCUMENTS

| Re. 31,551 | 4/1984 | Bjorke | 307/603 |
|---|---|---|---|
| 3,277,381 | 10/1966 | Sullivan | 307/603 |
| 3,562,670 | 5/1969 | Uchida | 307/603 |
| 3,712,994 | 7/1971 | Graziani | 307/603 |
| 4,504,749 | 3/1985 | Yoshida | 307/603 |
| 4,710,653 | 12/1987 | Yee | 307/601 |
| 4,845,390 | 7/1989 | Chen | 307/603 |
| 4,968,907 | 11/1990 | Pepper | 307/603 |

Primary Examiner—Janice A. Howell
Assistant Examiner—Toan Tran
Attorney, Agent, or Firm—Michael D. Rostoker; Gerald E. Linden

[57] ABSTRACT

A periodic sequence of signals is intiated and provided to a counter. During this time, a pulse (PULSE) is generated. Upon reaching a terminal count the pulse is terminated. The pulse is provided to a delay element which receives at its input a signal (s) entering, processed within or exiting a semiconductor device. The pulse and periodic sequence of signals are initiated by an edge detector detecting a trigger signal (TRIGGER), which may be the signal (s) being delayed. The sequence of signals is generated by a circuit element, such as a ring oscillator, and the periodicity of the sequence of signals is related to the inherent switching speed of the semiconductor device technology. A plurality of delay circuits are provided in a semiconductor device for individually delaying a plurality of signals entering, processed within and exiting the device. A library of delay circuits may pre-designed, and stored for implementation, as needed, in semiconductor devices. The delay imposed on signals entering, processed within and exiting the device is readily modified by modifying the periodicity of the sequence of signals and/or modifying the terminal count. Method and apparatus are disclosed.

8 Claims, 1 Drawing Sheet

CONFIGURABLE PULSE GENERATOR, ESPECIALLY FOR IMPLEMENTING SIGNAL DELAYS IN SEMICONDUCTOR DEVICES

This is a continuation of copending, commonly-owned U.S. patent application Ser. No. 568,268, filed Aug. 15, 1990, now abandoned.

TECHNICAL FIELD OF THE INVENTION

The invention relates to providing on-chip signal delays in semiconductor devices.

BACKGROUND OF THE INVENTION

Modern semiconductor devices require a precise degree of timing closure between various signals entering, being processed within and exiting the device. Generally, this requires interposing a pre-determined delay on various signals before they are further processed or presented to the outside world.

Typically, delay chains have been used, on-chip, to impose delays on such signals. In a typical straightforward approach, a plurality of logic gates, each having an inherent propagation delay, are connected (strung) together in a chain (in series) to effect an overall delay from the input of the string to the output of the string according to the number of interconnected gates in the chain. In semiconductor devices, this means that each delay chain must be pre-configured, and its overall delay remains fixed. Further, as semiconductor devices and their individual gates are becoming faster and faster, an enormous number of gates may need to be interconnected to achieve the desired delay in a particular delay chain for a particular signal, since the delay through each gate is related to the "inherent" switching speed of the device. In some instances, the overall number of gates needed to implement various delays in the semiconductor device may become quite large, seriously adversely impact the number of gates remaining for implementing the desired functionality for the device. Design time is also wasted on implementing various delay chains, the desired configuration of which may change during the design process as a result of device (e.g. logic) simulation and/or specification changes.

What is needed is a readily configurable delay generator that can be applied to various semiconductor technologies.

U.S. Pat. No. 3,539,926 discloses a digitally programmable monostable multivibrator wherein a high frequency oscillator (18) is keyed into oscillation by an incoming signal. The output of the oscillator initiates a counting process in a binary counter. The binary counter comprises a series of flip-flops corresponding to powers of two ($2^n$). A manually-selected switch (19) selectively enables gates (G10-G16), each gate connected to one of the flip-flops, in order that a signal that will terminate the operation of the oscillator (18). Apparently, the "resolution" of the time interval between the oscillator commencing and terminating oscillation is limited to powers of two times the oscillation frequency. Further, the oscillation frequency appears to be fixed. Further, there is no suggestion in this patent of using the pulsed output of the multivibrator in the context addressed by the present invention.

U.S. Pat. No. 3,840,815 discloses a programmable pulse width generator. The width of a first pulse, having a pre-determined width, is sequentially increased or decreased by increments corresponding to the combination of shorter pulses. A sequence of constant width pulses may also be generated.

U.S. Pat. No. 4,257,108 discloses a pulse generator for generating pulse groups with desired width and spacing, primarily directed to use in radar systems. A control frequency is derived, e.g. from a crystal oscillator, and the width and spacing of the pulse groups is controlled by PROM memories in the system.

U.S. Pat. No. 4,415,861 discloses a programmable pulse generator which generates a pulse having programmable leading and trailing edges. An oscillator starts to generate a pulse in response to a trigger signal, and the pulse is counted by a counter. Upon detection of the trailing edge of the pulse, the oscillation of the oscillator is stopped.

U.S. Pat. No. 4,441,037 discloses an internally gated variable pulsewidth clock generator which is able to provide output clock signals with the same rise rate as an external driving clock, and is particularly directed to the provision of timing signals in a digital display unit. An integrated circuit (20) is illustrated in FIG. 5 in which are implemented one or more clock generators (21A-21C). A clock generator (21) is illustrated in FIG. 6, and employs a double bootstrap configuration of gates (29 and 30) having different capacitances, and hence different discharge times. Due to a dynamic latch action, an output signal is not allowed to go low until an applied input signal goes low.

U.S. Pat. No. 4,488,062 discloses a pulse shaper having a periodically reversing capacitor for pulse shaping.

U.S. Pat. No. 4,509,494 discloses a pulse width control circuit receiving a periodic input signal and controlling the width of an output pulse by means of a negative feedback loop, the amount of negative feedback being varied in response to a detected voltage. Applicability to an ignition unit for internal combustion engines is noted.

U.S. Pat. No. 4,675,546 discloses an edge-programmable timing signal generator for generating timing signals having complete edge programmability for accommodating incrementally-adjustable variable pulse widths. A counter (1), clock (2) and memory circuit (3) form a coarse timing circuit (5) for generating a (coarse) timing signal having pulse widths which are variable by coarse time increments. The output of the coarse timing circuit is connected to a delay register (7) for delaying the generated coarse timing signal. The output of the coarse timing circuit is also applied to rising edge and falling edge delay lines (9 and 11.) By inverting signals input to the rising and falling edge delay lines, rising and falling edges are generated at any time during the period of the coarse timing signal.

U.S. Pat. No. 4,754,163 discloses a pulse generator with adjustable pulse frequency, pulse width and pulse delay. The output pulses of a start-stop oscillator, having a fixed operating frequency, are counted by a counter in adjustable counting cycles.

DISCLOSURE OF THE INVENTION

Generally, in the above-referenced patents, a fixed-frequency oscillator drives a counter to determine, by reaching a pre-determined, usually manually-selectable count, a time interval for an output pulse. In most cases, the output pulse, per se, is the sought after "end product", or is used as a clock (timing pulse) for controlling the overall timing of a system.

It will be noted, in contrast thereto, that in the present invention, generally, a delay element is created having an essentially configurable, fixed (i.e., once it is configured) delay based on the switching speed of integrated circuit technology in which the invention is implemented.

It is therefore an object of the present invention to provide a user-configurable pulse generator for implementation in semiconductor devices.

It is a further object of the invention to provide the designer with a technique for readily implementing a plurality of individual delays in a semiconductor device, in order to implement timing closure relatively effortlessly.

It is a further object of the invention to provide a gate-based delay mechanism that requires fewer interconnected gates.

According to the invention, a periodic sequence of signals is initiated by a trigger signal (TRIGGER) and provided to a counter. During this time, a pulse (PULSE) is generated. Upon reaching a terminal count the pulse is terminated. The pulse is provided to a delay element which receives at its input a signal (s) entering, processed within or exiting a semiconductor device. The signal (s) is preferably the trigger signal (TRIGGER).

According to an aspect of the invention, the pulse and periodic sequence of signals are initiated by an edge detector detecting a trigger signal, which may be the signal being delayed.

According to another aspect of the invention, the sequence of signals is generated by a circuit element, such as a ring oscillator, and the periodicity of the sequence of signals is related to the inherent switching speed of the semiconductor device technology.

According to another aspect of the invention, a plurality of delay circuits are provided in a semiconductor device for individually delaying a plurality of signals entering, processed within and exiting the device.

According to another aspect of the invention, a library of delay circuits are pre-designed, and stored for implementation, as needed, in semiconductor devices.

According to another aspect of the invention, the delay imposed on signals entering, processed within and exiting the device is readily modified by modifying the periodicity of the sequence of signals and/or modifying the terminal count.

Preferably, all of the above is implemented by elements, described hereinafter, on a single semiconductor chip. However, it is within the scope of this invention that the above-described functions are split between various semiconductor chips.

Method and apparatus are disclosed.

Other objects, features and advantages of the invention will become apparent in light of the following description thereof.

DETAILED DESCRIPTION OF THE INVENTION

Figure 1:
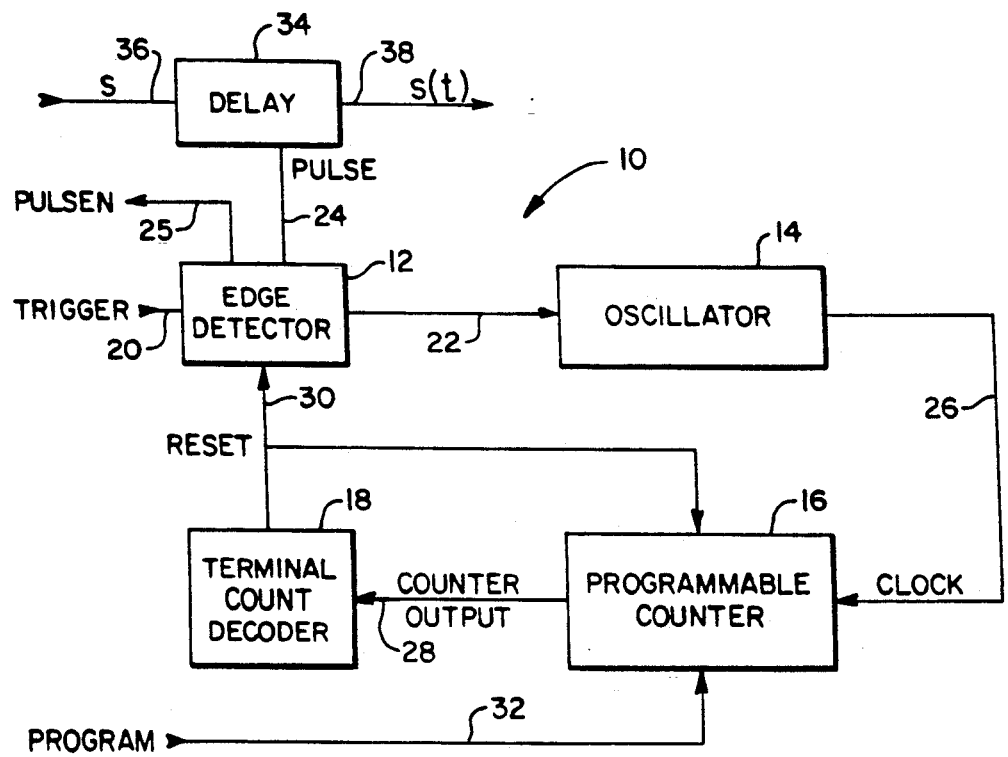
FIG. 1 is a schematic of the Configurable Delay Generator of the present invention.

FIG. 1 shows a pulse generator circuit 10, according to the present invention. It consists of the following major building blocks: an edge detector 12, an oscillator 14, a programmable counter 16 and a terminal count decoder 18, interconnected as shown.

When a trigger signal (TRIGGER) on a line 20 is applied to the input of the edge detector 12, the edge detector 12 performs two functions: 1) it provides an output signal on a line 22 to the input of the oscillator 14, and 2) it starts a pulse (PULSE) on a line 24. The edge detector may be a rising or falling edge detector, and has an additional output (PULSEN), which provides an indication on a line 25 of the sense (polarity) of the trigger signal.

The signal on the line 22 starts the oscillator 14, which will provide a series of clock signals (CLOCK) on a line 26 to the input of the programmable counter 16, and the counter will start counting (e.g. by ones, from zero), and will provide a signal (COUNTER OUTPUT) indicative of the count on a parallel line 28 to the terminal count decoder 18.

The terminal count decoder 18 monitors the count value and, upon the count value reaching a pre-determined terminal count (e.g. 255), the terminal count decoder 18 will generate a reset signal (RESET) on a line 30 that will: 1) reset the counter 16 (e.g. to zero), and 2) reset the edge detector 12 to terminate its output (PULSE). The circuit 10 is then reset and ready to react to the next trigger pulse arriving on the line 20, which starts the above-described process anew.

A signal (PROGRAM) is provided on a line 32 for establishing the terminal count in the counter 16. However, the terminal count can be "fixed", such as at thirty two for a five bit binary counter.

Each of the above-described components 12, 14, 16 and 18, taken individually, are well known.

In the manner described above, the circuit 10 generates a signal (PULSE) on the line 24, the duration (t) of which is determined by the frequency (f) of the oscillator 14 and the value (n) of the pre-determined terminal count, according to the relationship $t = n/f$.

This signal (PULSE) is provided as a control signal to a delay circuit 34, the delay circuit 34 receiving at its input 36 a signal "s" to be delayed and outputting on a line 38 as a signal "s(t)" at a later time (e.g., delayed by the duration of the PULSE).

In a most straightforward approach, the signal (s) on the line 36 is simply the trigger signal (TRIGGER) on the line 20 (i.e., the lines 20 and 36 are tied together).

As mentioned hereinbefore, it has been known to construct delay generators from a chain of logic gates, such as inverters connected in series, in order to delay a signal such as "s" by a time (t). In prior realizations of this approach, longer delays were generated simply by making the number of gates in the chain larger. For example, if the signal "s" experienced a propagation delay of 10 ns (nanoseconds) through each inverter, a sixteen thousand inverter long chain would be required to impose a delay of 160 μs (microseconds) on the signal. While this approach is certainly straightforward, it is obviously not gate-efficient, and is further inapposite in light of the faster switching speeds being realized with modern semiconductor technologies, since more and more gates would be required to implement a given delay in faster technologies.

Using the present technique, the number of gates required to impose various delays can significantly be reduced. This is especially important when there are many signals entering, being processed within and exiting a semiconductor device, especially a gate array type device or ASIC device.

The combination of the Programmable Pulse Generator 10 and Delay element 34 are termed "Configurable Delay Generator".

Figure 2:
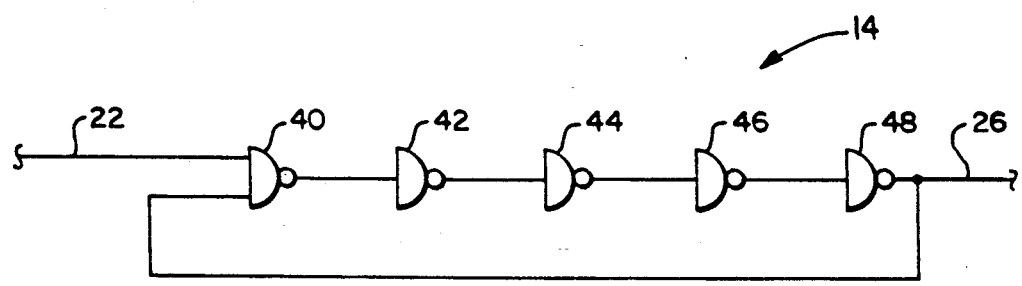
FIG. 2 is a schematic of an exemplary element of the Configurable Delay Generator of FIG. 1.

FIG. 2 shows in greater detail the construction of a suitable, gate-efficient oscillator 14 for use with the circuit 10.

The exemplary oscillator 14 consists of an AND gate 40, receiving at one of its inputs the output of the edge detector 12 on the line 22. The output of the AND gate 40 is inverted, and is provided to a series-connected chain of inverters 42, 44, 46 and 48, each of which has its output inverted. The output of the last inverter 48 in the chain is provided as a clock pulse on the line 26, and is also provided back to the other input of the AND gate to re-propagate through the chain. Such a free running oscillator, known as a "ring oscillator", is generally well known.

By way of example, each inverter 42-48 imposes a delay of 10 ns on a signal arriving on the line 22 (for purposes of this example, the delay of the AND gate is ignored). Hence, the total delay through the inverter chain 42-28 is 40 ns, and the periodicity of the clock signals on the line 26 is 40 ns. With a five bit counter connected to the output 26 of the inverter chain 42-28, a terminal count of thirty two would represent a delay of approximately 1.3 μs (32 counts×40 ns).

Hence, with a four gate delay chain 42-28, an AND gate 40, edge detector 12, a counter 16, a terminal count decoder 18, and a delay circuit 34, a delay that otherwise would require in excess of one thousand gates can be achieved. For longer delays, even greater savings in gate usage can be achieved.

Implementation in Semiconductor Devices

The invention is directed to implementation within a semiconductor device. Many different technologies are used to create these devices, each having its own "inherent" speed, in other words the nominal switching speed of a basic gate structure.

The above-described pulse generator circuit/delay element combination is useful for imposing a delay on a signal entering, processed within or exiting the semiconductor device. For effecting timing closure among a plurality of such signals, a plurality of such circuits/delay elements would be employed, each operating on a particular signal.

In light of achieving the stated object of readily implementing a plurality of individual delays, it is important to note that a single counter/terminal count decoder can be a predesigned as a macro function in the library of a design compiler, for selection by the designer. In this regard, the terminal count would be "fixed", e.g. at thirty two with a five bit counter. In order to achieve different delays for signals within the semiconductor device, the period of the oscillator would be varied, e.g. by altering the length of the inverter chain (42-48).

It is also possible that different size counters/terminal decoders could be stored in the design library (e.g. four, six, seven and eight bit counters/terminal decoders). Larger counters could be selected when it was determined that the length of the inverter chain required to achieve a particularly long delay was becoming inappropriately large.

Notably, in the example of using an inverter chain 42-48 for generating a sequence of periodic signals driving the counter, the periodicity of the signals is directly dependent upon the inherent speed of the semiconductor device. In this manner, the periodicity of the chain can be selected to be any integral multiple of the inherent device speed (again, ignoring the effect of the AND gate 40). Preferably, there are always an even number of inverters in the chain, in which case the periodicity would be limited to even number multiples of the inherent device speed. In other words, the "resolution" of the delay that can be imposed on a signal within the semiconductor device can be as small as the inherent speed of the semiconductor device. Viewed in another light, the frequency (periodicity) of the oscillator 14 is related to the speed of the device.

The invention offers the designer a number of design choices, all of which are generally directed to conserving the number of gates allocated to timing closure. Given the oscillator described above (FIG. 2), and a five bit counter, delays of up to 128 times the inherent device speed are readily achieved. For a delay twice as large, the length of the inverter chain could be doubled, or a counter having one more bit (and hence more gates) could be used. This is a tradeoff within the purview of the designer, and the invention affords the designer a highly desirable degree of flexibility and simplicity in making these design choices so that their efforts can be more productively directed to the ensuring the appropriate functionality of the device.

Regarding the oscillator 14, while one specific embodiment has been discussed (see FIG. 2), it should be noted that virtually any delay element could be used to generate an appropriate sequence of signals for driving the counter.

Further, while the invention is preferably formed on a single chip of a semiconductor device, often functions of semiconductor devices are split between two or more chips. Thus, it is also contemplated that a number of delay elements 34 would reside on one chip of a chip set, while a similar number of pulse generators 10 would reside on other chip(s) in the chip set.

What is claimed is:

1. In a semiconductor device, a configurable pulse generator for imposing a delay on a signal entering, processed within or exiting the semiconductor device, the configurable pulse generator in the semiconductor device comprising:

a first line receiving an input signal "s" entering, processed within or exiting the semiconductor device;

a delay element connected to the first line and imposing a delay of time "t" on the input "s" and outputting the input signal "s" on d second line as delayed input signal "s(t)";

a third line receiving a trigger signal;

an edge detector connected to the third line and providing a pulse output signal for the time "t" on a fourth line to the delay element, in and only in response to occurrence of the trigger signal, and until the occurrence of a reset signal, for delaying outputting the input signal "s" onto the second line, and for providing a signal on a fifth line for the time "t";

an oscillator connected to the fifth line and providing a stream of periodic clock pulses on a sixth line in and only in response to the signal on the fifth line;

a programmable counter connected to the sixth line and counting the clock pulses on the sixth line for the time "t", and providing on a seventh line a signal indicative of a predetermined number of clock pulses counted;

a terminal count decoder connected to the seventh line, providing the reset signal on an eighth line to the edge detector for terminating the pulse output signal upon occurrence of a predetermined number of clock pulses equating with the time "t", causing the delay element to output the delayed input signal "s(t)", providing the reset signal on the eighth line to reset the counter, and allowing the pulse generator to impose a like delay on a subsequent signal entering, processed within or exiting the semiconductor device.

2. Configurable pulse generator, according to claim 1:
wherein the first and third lines are connected together so that the input signal acts as the trigger signal.

3. Configurable pulse generator, according to claim 1, wherein:
the oscillator is implemented, in the semiconductor device, as a free-running ring oscillator, comprising:
an AND gate having one of its two inputs connected to the fifth line, and an output;
a series-connected chain of inverters, the first in the series of which is connected to the output of the AND gate, the last in the series of which is connected to the other of the two inputs of the AND gate and to the sixth line.

4. Configurable pulse generator, according to claim 3, wherein:
each inverter has an inherent silicon delay; and
the periodicity of the periodic clock pulses on the sixth line is determined by the number of inverters and by the inherent silicon delay of each inverter.

5. Configurable Pulse Generator according to claim 4, wherein:
the periodicity of the periodic clock pulses is a whole number multiple of the inherent silicon delay of each inverter.

6. Configurable pulse generator, according to claim 4, wherein:
the programmable counter includes a binary counter; and
the delay imposed on the input signal "s" is a multiple of the periodicity of the periodic clock pulses.

7. Configurable pulse generator, according to claim 6, wherein:
the delay imposed on the input signal "s" is an even multiple of a time interval between periodic clock pulses.

8. In a semiconductor device, a plurality of configurable pulse generators for imposing delays on a plurality of signals entering, processed within or exiting the semiconductor device, each configurable pulse generator comprising:
a first line receiving an input signal "s" entering, processed within or exiting the semiconductor device;
a delay element connected to the first line and imposing a delay of time "t" on the input signal "s" and outputting the input signal "s" on a second line as delayed input signal "s(t)";
a third line receiving a trigger signal;
an edge detector connected to the third line and providing a pulse output signal for the time "t" on a fourth line to the delay element, in and only in response to occurrence of the trigger signal, and until the occurrence of a reset signal, for delaying outputting the input signal "s" onto the second line, and for providing a signal on a fifth line for the time "t";
an oscillator connected to the fifth line and providing a stream of periodic clock pulses on a sixth line in and only in response to the signal on the fifth line;
a programmable counter connected to the sixth line and counting the clock pulses on the sixth lien for the time "t", and providing on a seventh line a signal indicative of a predetermined number of clock pulses counted;
a terminal count decoder connected to the seventh line, providing the reset signal on an eighth line to the edge detector for terminating the pulse output signal upon occurrence of a predetermined number of clock pulses equating with the time "t", causing the delay element to output the delayed input signal "s(t)", providing the reset signal on the eighth line to reset the counter, and allowing the pulse generator to impose a like delay on a subsequent signal entering, processed within or exiting the semiconductor device.

* * * * *